United States Patent
Yang et al.

(10) Patent No.: US 9,299,609 B2
(45) Date of Patent: Mar. 29, 2016

(54) HARD-MASK DEFINED BIT PATTERN SUBSTRATE

(71) Applicant: SEAGATE TECHNOLOGY LLC, Cupertino, CA (US)

(72) Inventors: XiaoMin Yang, Livermore, CA (US); Shuaigang Xiao, Fremont, CA (US); Yautzong Hsu, Fremont, CA (US); Zhaoning Yu, Palo Alto, CA (US); Kim Y. Lee, Fremont, CA (US); David S. Kuo, Palo Alto, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/339,052

(22) Filed: Jul. 23, 2014

(65) Prior Publication Data

US 2016/0027681 A1 Jan. 28, 2016

(51) Int. Cl.
*H01L 21/66* (2006.01)
*G01R 31/26* (2014.01)
*H01L 21/768* (2006.01)

(52) U.S. Cl.
CPC ...... *H01L 21/7688* (2013.01); *H01L 21/76802* (2013.01); *H01L 21/76832* (2013.01)

(58) Field of Classification Search
CPC .................. H01L 21/7688; H01L 21/76832; H01L 76/76802
USPC .................................................. 438/22
See application file for complete search history.

(56) References Cited

U.S. PATENT DOCUMENTS

| | | | |
|---|---|---|---|
| 8,475,670 B2 * | 7/2013 | Grobis | G11B 5/59688 216/22 |
| 8,673,541 B2 | 3/2014 | Xiao et al. | |
| 2009/0001047 A1 * | 1/2009 | Pelhos | B82Y 10/00 216/22 |
| 2013/0081937 A1 | 4/2013 | Albrecht | |
| 2013/0084468 A1 | 4/2013 | Albrecht et al. | |
| 2014/0205818 A1 * | 7/2014 | Schwartz | G03F 7/16 428/201 |
| 2014/0218824 A1 * | 8/2014 | Grobis | G11B 5/855 360/135 |
| 2015/0262606 A1 * | 9/2015 | Xiao | G11B 5/855 428/210 |

* cited by examiner

*Primary Examiner* — David S Blum (57) ABSTRACT

Provided is an apparatus that includes a substrate; a first hard-mask pattern that includes a number of first features disposed over a top surface of the substrate; and a second hard-mask pattern disposed over the first hard-mask layer. The second hard-mask pattern includes a number of second features overlapping one or more of the first features.

14 Claims, 7 Drawing Sheets

HARD-MASK DEFINED BIT PATTERN SUBSTRATE

BACKGROUND

Patterned recording media such as bit-patterned media (BPM) may be fabricated with rectangular-shaped islands or bits with bit pattern densities approaching 1 Tb/in$^2$. The bit pattern of BPM may include bits that correspond to the data zone and servo zones of a hard-disk drive (HDD). The process of transferring the BPM bit pattern onto the media substrate surface may involve the use of a lithographic technique, for example imprint lithography. In the case of imprint lithography, one or more imprint templates with a pattern having a BPM bit pattern is applied to a resist layer on the media substrate surface. A master template may be used to fabricate the imprint templates used to transfer the bit pattern onto the BPM.

SUMMARY

Provided herein is an apparatus that includes a substrate; a first hard-mask pattern that includes a number of first features disposed over a top surface of the substrate; and a second hard-mask pattern disposed over the first hard-mask layer. The second hard-mask pattern includes a number of second features overlapping one or more of the first features.

These and other features and aspects may be better understood with reference to the following drawings, description, and appended claims.

DESCRIPTION

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

Provided herein are embodiments that provide for fabricating a high-density master template for bit-patterned media (BPM). The storage capacity of BPM is proportional to the density of discrete magnetic islands or bits on the media substrate surface. Fabrication of high-density BPM may include the use of relatively low-density templates to imprint intersecting low-density patterns on resist layers over the media substrate surface. The density of the low-density patterns on the resist layers are increased through the use of directed self-assembly (DSA) techniques. In some embodiments, DSA techniques increase the density of low-density patterns by an integer multiple though the use of selected block copolymers (BCP).

BPM may include a high-density pattern of discrete magnetic bits formed on a media substrate surface. For example, the discrete magnetic bits of the BPM may have a rectangular or hexagonal shape. In particular embodiments, the bits of the BPM may be dimensioned such that the corresponding magnetic features in the patterned recording medium may have a bit aspect ratio (BAR) between about 1 and 4. The BAR may refer to a ratio of a major dimension or a down-track direction to a minor dimension or a cross-track direction. For example, the bits may be dimensioned such to have a BAR between about 1 and 4, a BAR between about 1 and 3, or a BAR between about 1 and 2. As an example, the bits of the BPM may be approximately 10 nanometers (nm) in the minor dimension or a cross-track direction and approximately 40 nm, 30 nm, 20 nm, or 10 nm in the major dimension or a down-track direction.

In particular embodiments, forming the BPM bit pattern BPM may involve the use of a lithographic technique (e.g., electron-beam (e-beam) lithography, photolithography, or imprint lithography). In the case of imprint lithography, one or more templates (e.g., micro-imprint template, nano-imprint template, etc.) may be applied to a resist layer on the media substrate surface. In particular embodiments, for example an imprint template may include a pattern of rectangular shaped bits that is imprinted on a resist layer of the media substrate surface.

Figure 1:
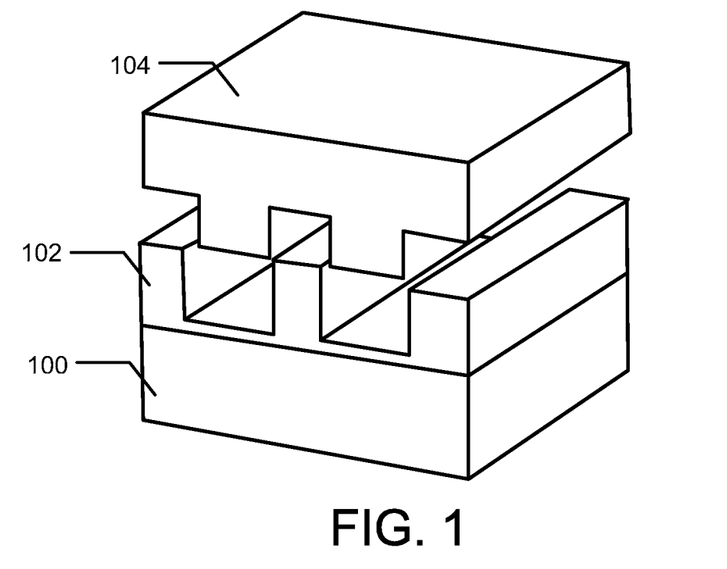
FIG. 1 illustrates an example pattern imprint using a low-density template, according to one aspect of the present description.

FIG. 1 illustrates an example pattern imprint using a low-density template, according to one aspect of the present description. Although this disclosure illustrates and describes particular methods of forming a low-density pattern on a particular substrate and of transferring the low-density pattern to particular types of resist layers, this disclosure contemplates any suitable methods of forming a low-density pattern on any suitable substrate and of transferring the low-density pattern to any suitable type of resist layer, such as direct-write lithography or photolithography.

The imprint template may be formed on a template substrate 100 of transparent material. Furthermore, template substrate 100 may be a conducting, semiconducting, non-conducting material, such as silicon (Si), quartz, carbon (C), chromium (Cr), tantalum (Ta), or any other suitable material. In particular embodiments, resist layer 102 may be deposited on a surface of template substrate 100. In particular embodiments, an initial low-density pattern may be made on a resist layer 102. As an example, pitch distance of the initial low-density pattern may be approximately 50 nm. The initial low-density pattern may be formed on a pattern substrate 104 using any suitable lithography technique (e.g., e-beam lithography or photolithography). For example, pattern substrate 104 may be a quartz or PYREX substrate. As an example, resist layer 102 may be a thermal plastic, such as polymethyl methacrylate (PMMA), polystyrene (PS), or styrene acrylonitrile (SAN). In particular embodiments, resist layer 102 may be deposited on hard-mask layer 106 using a spin-coating process. The initial low-density pattern may be transferred from pattern substrate 104 to resist layer 102 through application of pattern substrate 104 onto resist layer 102. For example, transparent substrate 104 may be pressed into contact with resist layer 102 at a pressure in the range of approximately 0.2 to 10 megapascals (MPa). In particular embodiments, a plasma ashing or "descum" process may be performed on resist layer 102 after patterning to reduce the thickness of resist layer 102 and to expose hard-mask layer 106 in the patterned areas of resist layer 102. For example, the height of the features of the imprinted resist layer 102 after the descum process may be in the range of approximately 2 nm to 4 nm. In particular embodiments, the space between features of imprinted resist layer 102 may be deposited with material that acts as a seed layer for the subsequent directed self-assembly process.

Figure 2:
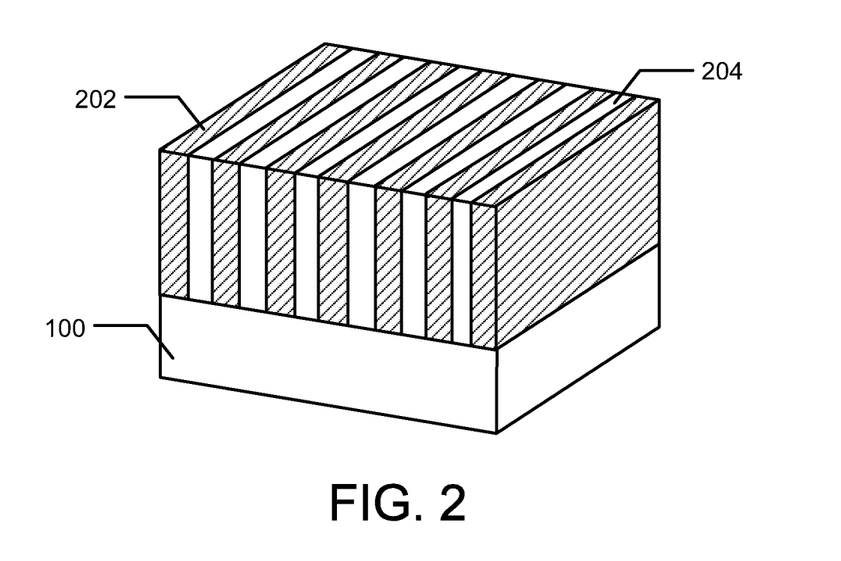
FIG. 2 illustrates an example directed self-assembly (DSA) pattern, according to one aspect of the present description.

FIG. 2 illustrates an example directed self-assembly (DSA) pattern, according to one aspect of the present description. In particular embodiments, a high-density version of the imprinted pattern may be formed using a DSA technique. The DSA technique forms self-assembling structures using block copolymers (BCP) 202 and 204 described below. In particular embodiments, resist layer 102 with the imprinted pattern is cured and one or more additional processes may be performed to prepare template substrate 100 and resist layer 102 for coating with BCPs 202 and 204. For example, the coating of BCPs 202 and 204 may be annealed to laterally segregate BCPs 202 and 204 into a self-assembled Lamellar structure having a lateral spatial pitch of $L_0$. As an example, annealing may be a thermal, chemical (including solvent), or irradiative process.

The imprinted low-density pattern transferred to resist layer 102 acts to confine or direct the self-assembly of BCPs 202 and 204. Depending on the choice of BCPs 202 and 204, the linear density of the Lamellar BCP 202 and 204 structures may be n times the linear density of the initial low-density features imprinted in resist layer 102, as illustrated in the example of FIG. 1, where n is an integer density multiplication factor=0, 1, 2, 3, etc. A composition of BCPs 202 and 204 may be selected to have a particular value of n based on the molecular weight and lateral spatial pitch $L_0$ of BCPs 202 and 204. As an example, low-density pattern imprinted on resist layer 102 may have a pitch distance L, such that relationship between the pitch distance L and lateral spatial pitch distance $L_0$ of the BCP 202 and 204 structures may be determined by the following equation:

$$L_0 = L/n \qquad (1)$$

For example, BCPs 202 and 204 may be selected such that n=2 and the lateral spatial pitch distance $L_0$ of the Lamellar structure is approximately half the pitch distance L of the initial low-density pattern of pattern substrate 204 that is imprinted on resist layer 102. As an example, pitch distance L of the initial low-density pattern may be approximately 50 nm and the lateral spatial pitch distance $L_0$ of the Lamellar structure may be approximately 25 nm.

In particular embodiments, BCP 202 or BCP 204 comprise an organic polystyrene-block-polymethylmethacrylate (PS-b-PMMA), polystyrene-block-poly2 vinylpyridine, polystyrene-block-poly4-vinylpyridine, polystyrene-block-polyethyleneoxide, polystyrene-block-polyisoprene, or polystyrene-block-butadiene. In other embodiments, BCP 202 or BCP 204 comprise an inorganic polystyrene-block-polydimethylsiloxane (PS-b-PDMS or, more compactly, PS-PDMS) or polystyrene-block-polyferrocenylsilane. The processes described herein may be varied depending upon the chemical characteristics of the selected BCPs 202 and 204. The selection of BCPs 202 and 204 may also depend upon a target DSA pattern. For example, the topographical pattern left by the imprinting described above may determine the selection of BCPs 202 and 204, since certain BCPs 202 and 204 may correlate better with particular topographical pattern features or dimensions, for example PS-PDMS may be utilized to form spherical DSA structures. As an example, BCPs 202 and 204 may be used may be used to form cylindrical, Lamellar, spherical DSA structures, or any combination thereof. In particular embodiments, BCP 202 and 204 may include organic components, inorganic components, or any suitable combination of organic and inorganic components. As described above, the selection of BCPs 202 and 204 may be based upon the size, molecular weight, or other features of BCPs 202 or 204. Although this disclosure describes particular BCPs selected to form particular DSA structures, this disclosure contemplates selections of any suitable BCP to form any suitable DSA structures.

Figure 3:
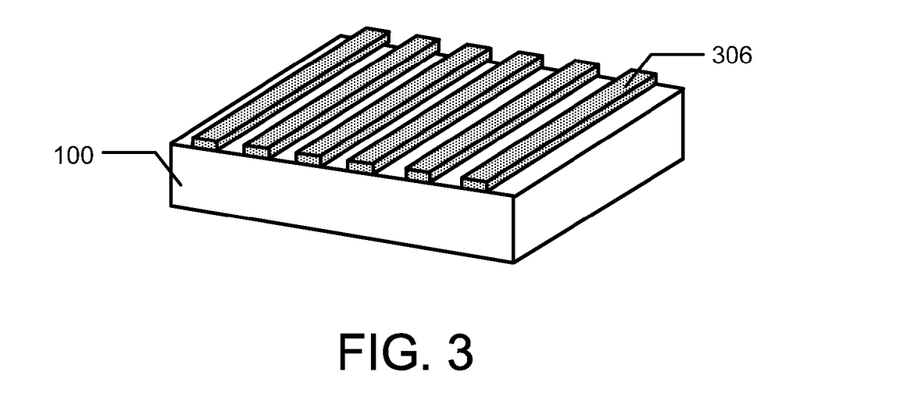
FIG. 3 illustrates an example hard-mask pattern, according to one aspect of the present description.

FIG. 3 illustrates an example hard-mask pattern, according to one aspect of the present description. In particular embodiments, BCP 202 may be removed from the Lamellar structure, illustrated in the example of FIG. 2. In other embodiments, BCP 204 may be removed instead of BCP 202 from the Lamellar structure. As described above, BCPs 202 and 204 are annealed to induce lateral segregation of BCPs 202 and 204. In particular embodiments, a selective etch may be performed to remove BCP 204 and resist layer 102 after annealing. The selective etch may be an $O_2$ reactive ion etch (RIE), for example, which may not substantially remove BCP 202, such that BCP 202 functions as a sacrificial layer of hard-mask layer 306. Removal of one of BCP 202 or BCP 204 exposes one or more portions of template substrate 100 underneath the removed BCP (e.g., 204).

Hard-mask layer 306 may be deposited on the exposed portions of template substrate 100 and the remaining BCP (e.g., 202) using sputtering, chemical vapor deposition (CVD), or plasma-chemical vapor deposition (PCVD). For example, hard-mask layer 306 may be chromium, aluminum, tantalum, diamond-like carbon (DLC), $SiN_x$ ($0.5 \leq x \leq 1.35$), $ZrO_x$ (x in a range between 1 and 2), or $WC_x$ (x in a range between 0.5 and 1). In particular embodiments, a second selective etch is performed to remove BCP 202, such that the portions of hard-mask layer 106 deposited on BCP 202 are removed and a pattern in hard-mask layer 306 is formed, as illustrated in the example of FIG. 3.

In other embodiments, hard-mask layer 306 may be deposited prior to deposition of resist layer 102 and BCPs 202 and 204. In this case, the removal of BCP (e.g., 204) exposes portions of hard-mask layer 306 and the remaining BCP (e.g., 202) acts as an etch mask protecting portions of hard-mask layer 306. The selective RIE etch may then etch the exposed portions of hard-mask layer 306 down to template substrate 100, thereby resulting in a pattern of hard-mask layer 306 illustrated in FIG. 3.

In other embodiments, the density of the pattern may be further increased through line or feature doubling process that reduces the lateral spatial pitch distance $L_0$ by a factor of 2. As an example, a deposition of a generally conformal or uniform thickness layer of an oxide layer, for example $Al_2O_3$, over the features of the remaining BCP (e.g., 202) and the exposed portions of template substrate 100. The conformal deposition may be performed using atomic layer deposition (ALD). The conformal layer may be removed from the top surface of the remaining BCP (e.g., 202), thereby exposing the remaining BCP 202. In particular embodiments, removal of $Al_2O_3$ may be directionally selective, such that the conformal layer on the side walls of the remaining BCP 202 are preserved. For example, the directionally selective removal of the conformal layer may be accomplished through ion milling using $Ar^+$ ions. Additional selectivity may be provided by cooling template substrate 100 or by reducing the thermal energy of the ions, such that most of the ions do not have enough energy to break the conformal layer without assistance from the kinetic energy provided by the ion gun (and which is disposed to emit the ions in a substantially vertical direction). The exposed BCP 202 may be removed, as described above, thereby leaving the conformal layer as an etch mask for the deposited hard mask-layer 306 in place of the remaining BCP.

Figure 4:
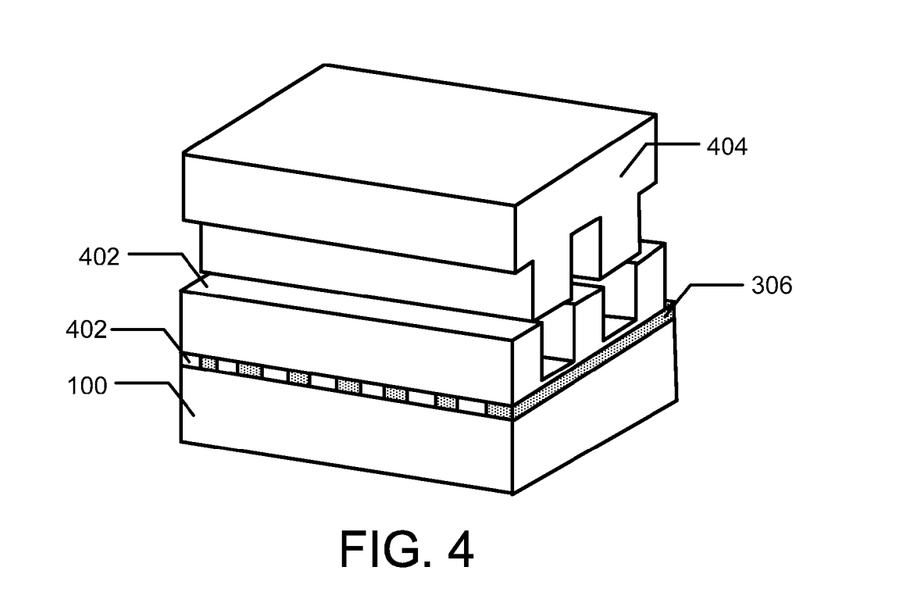
FIG. 4 illustrates an example pattern imprint using another low-density template, according to one aspect of the present description.

FIG. 4 illustrates an example pattern imprint using another low-density template, according to one aspect of the present description. In particular embodiments, a second low-density pattern may be imprinted over a resist layer 402, as illustrated in the example of FIG. 4. The second low-density pattern may be formed on a second pattern substrate 404. In particular embodiments, second pattern substrate 404 may be aligned such that the features of the second low-density pattern may substantially perpendicularly intersect the features of hard-mask layer 306. In other embodiments, second pattern substrate 404 may be aligned such that features of the second low-density pattern imprinted on resist layer 402 may intersect the features of hard-mask layer 306 at a non-90° or any suitable angle. The second low-density pattern may have features with a pitch distance L'. In particular embodiments, a pitch distance L' of the second low-density pattern may be substantially similar to the pitch distance L of the features of the initial low-density pattern. In other embodiments, a ratio of the pitch distance L' of the second low-density pattern to the pitch distance L of the features of the initial low-density pattern may be based on the BAR of the discrete magnetic bits.

As an example, resist layer 402 may be a material that is substantially similar to resist layer 102 and may be deposited on the hard-mask pattern using a spin-coating process, as described above. Furthermore, the spin-coating process may also cover the portions of template substrate 100 exposed by the hard-mask pattern. The second low-density pattern may be transferred from second pattern substrate 404 to resist layer 402 through application of second pattern substrate 404 onto resist layer 402. For example, second pattern substrate 404 may be pressed into contact with resist layer 402 in a similar fashion to the imprint process described above.

Figure 5:
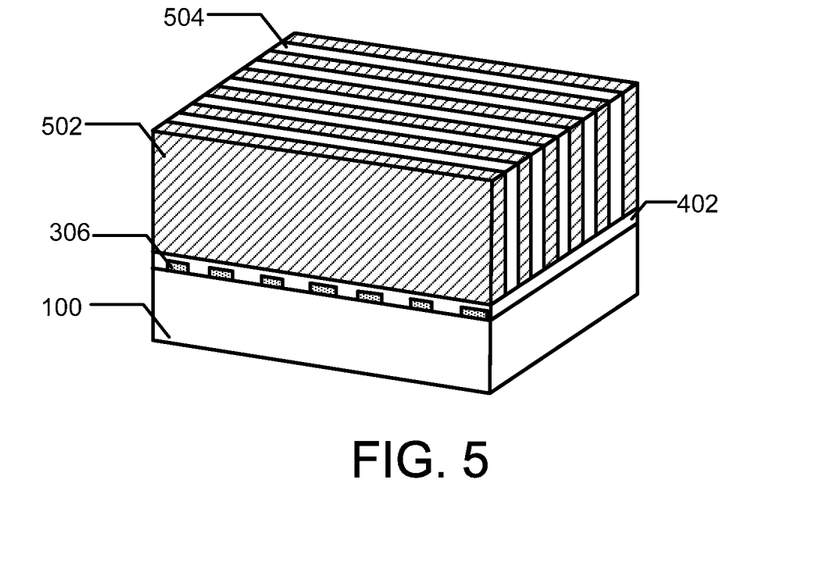
FIG. 5 illustrates another example directed self-assembly (DSA) pattern, according to one aspect of the present description.

FIG. 5 illustrates another example directed self-assembly (DSA) pattern, according to one aspect of the present description. A high-density version of the second imprinted pattern may be formed using the DSA technique described above. Resist layer 402 with the second imprinted pattern may be cured and one or more additional processes may be performed to prepare and resist layer 402 for coating with BCPs 502 and 504. The deposited BCPs 502 and 504 may be annealed to laterally segregate BCPs 502 and 504 into a self-assembled Lamellar structure, as illustrated in the example of FIG. 5, having a lateral pitch distance of $L'_0$. Depending on the choice of BCPs 502 and 504, lateral pitch distance of $L'_0$ of the Lamellar BCP 502 and 504 structures may be correlated to the linear density of the initial low-density features imprinted in resist layer 402 through integer density multiplication factor n'=0, 1, 2, 3, etc. A composition of BCPs 502 and 504 may be selected to have a particular value of n' based on the molecular weight and lateral spatial pitch distance $L'_0$ of BCPs 502 and 504. Furthermore, the relationship of lateral spatial pitch distance $L'_0$ of BCPs 502 and 504 to the pitch distance L' of the second low-density pattern is substantially similar to that described by equation (1) and substituting L', $L'_0$, and n' for L, $L_0$, and n respectively.

In particular embodiments, BCPs 502 and 504 may be similar to BCPs 202 and 204 such that the lateral spatial pitch distance $L'_0$ of the Lamellar structure may be substantially similar to the lateral spatial pitch distance $L_0$ of the DSA pattern illustrated in the example of FIG. 2. In other embodiments, BCPs 502 and 504 may be different than BCPs 202 and 204. Furthermore, based on the compositions of BCPs 202, 204, 502, and 504, a ratio of the pitch distance $L'_0$ of the second Lamellar structure in the example of FIG. 5 to the lateral spatial pitch distance $L_0$ of the first Lamellar structure in the example of FIG. 2 may be based on the BAR of the discrete magnetic bits.

Figure 6:
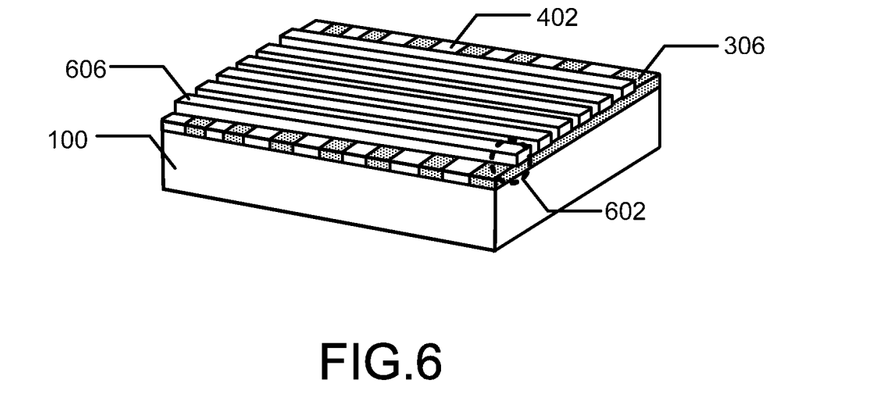
FIG. 6 illustrates an example BCP pattern, according to one aspect of the present description.

FIG. 6 illustrates an example BCP pattern, according to one aspect of the present description. In particular embodiments, one of BCP 502 or BCP 504 may be removed from the Lamellar structure using a selective etch process, such that the remaining BCP (e.g., 502) may be used as a sacrificial layer for a second hard-mask layer 606. In other embodiments, the function of BCPs 502 and 504 may be reversed, such that BCP 502 is removed from the Lamellar structure and BCP 504 functions as the sacrificial layer. Second hard-mask layer 606 may be deposited in a similar manner as hard-mask layer 306 described above. In particular embodiments, second hard-mask layer 606 is a different material than hard mask layer 306, such that second hard-mask layer 606 has different etch behavior than hard-mask layer 306. For example, hard-mask layer 306 may be an aluminum layer whilst second hard-mask layer 606 may be a chromium layer. In particular embodiments, a second selective etch is performed to remove BCP 502, such that the portions of hard-mask layer 606 deposited on BCP 502 are removed and a pattern in hard-mask layer 606 is formed, as illustrated in the example of FIG. 6. In particular embodiments, the pitch distance of the second hard-mask layer may be reduced using the line or feature doubling process described above.

As described above, features of the hard-mask layer 606 may overlap or intersect 602 the features of hard-mask layer 306 to form a substantially perpendicular angle. In other embodiments, second pattern substrate 404 may be aligned such that features of the second low-density pattern imprinted on resist layer 402 may overlap or intersect the features of hard-mask layer 306 at a non-90° or any suitable angle.

Figure 7:
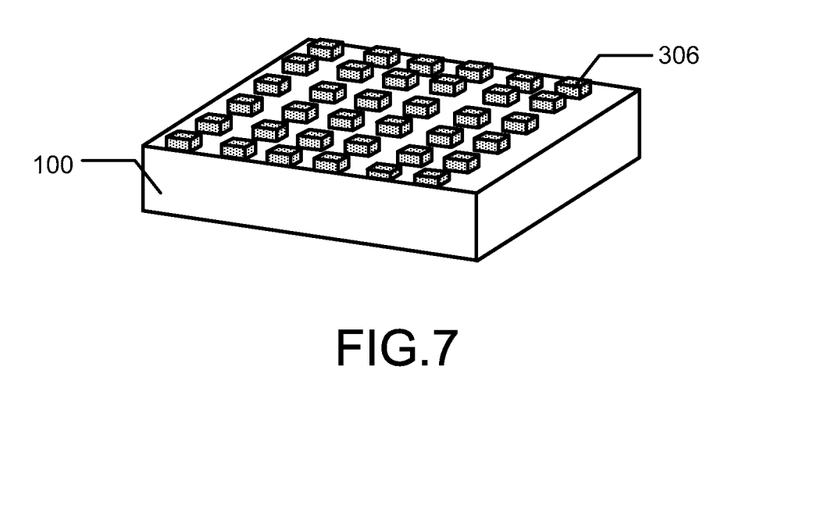
FIG. 7 illustrates an example hard-mask bit pattern, according to one aspect of the present description.

FIG. 7 illustrates an example hard-mask bit pattern, according to one aspect of the present description. In particular embodiments, a first selective etch may be performed that preferentially removes hard-mask layer 306 whilst leaving hard-mask layer 606 substantially intact, such that hard-mask layer 606 functions as an etch mask protecting portions of hard-mask layer 306 underneath. In particular embodiments, a second selective etch is performed that preferentially removes hard-mask layer 606 whilst leaving hard-mask layer 306 substantially intact, such that islands or bits of hard-mask layer 306 remain at the intersection 602 of the hard-mask layers 306 and 606, as illustrated in the example of FIG. 7.

Figure 8:
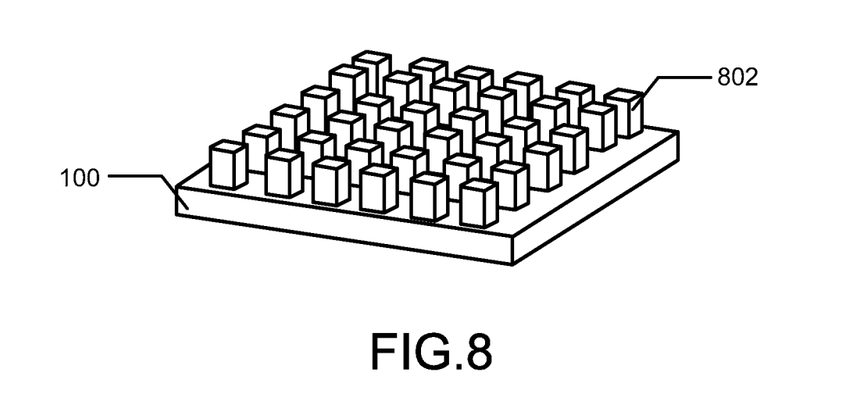
FIG. 8 illustrates an example bit pattern of an imprint template, according to one aspect of the present description.

FIG. 8 illustrates an example bit pattern of an imprint template, according to one aspect of the present description. In particular embodiments, islands of hard-mask layer 306 may function as an etch mask for template substrate 100. A selective etch may be performed that preferentially etches the material of template substrate 100 whilst leaving hard-mask layer 306 substantially intact. In particular embodiments, islands or bits 802 of material of template substrate 100 may be defined by the pattern of hard-mask layer 306, as illustrated in the example of FIG. 7. The selective etch may be performed for a pre-determined period of time, such that islands of material 802 of template substrate 100 are at a pre-determined height. As described above, template substrate 100 may be used to transfer the pattern of bits 802 to other substrates to be used for subsequent imprint lithography on media substrate surfaces.

Figure 9:
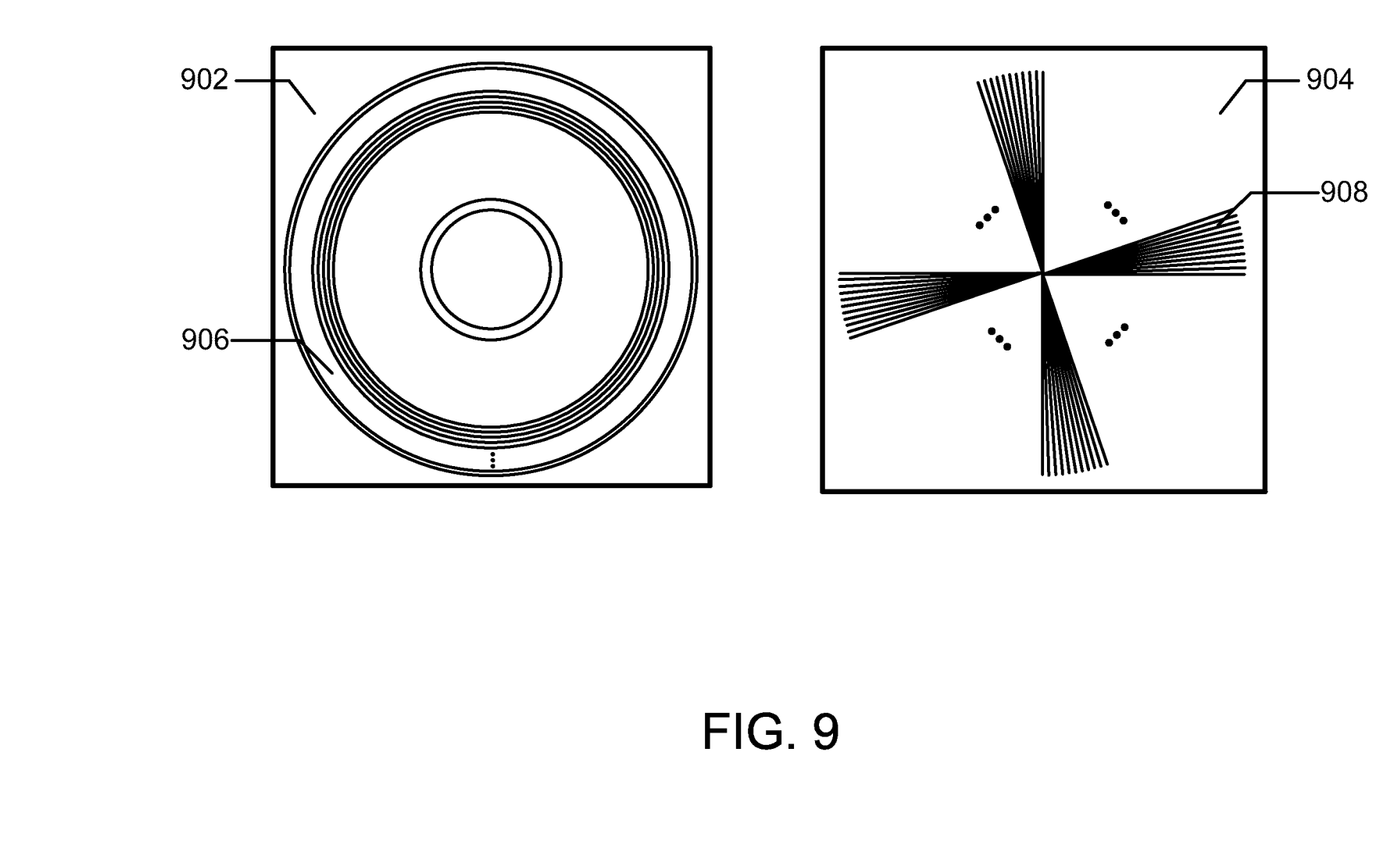
FIG. 9 illustrates example pattern templates, according to one aspect of the present description.

FIG. 9 illustrates example pattern templates, according to one aspect of the present description. Although this disclosure illustrates and describes a particular number of pattern templates having particular patterns, this disclosure contemplates any suitable number of pattern templates having any suitable patterns, such as patterns to form hexagonal shaped bits. As described above, a pattern 906 of relatively low resolution may be created on a pattern substrate 902 and a pattern 908 of relatively low resolution may be created on the second pattern substrate 904. As an example, pattern substrates 902 and 904 may be used in as pattern substrates 104 and 404 respectively. As another example, pattern substrates 904 and 902 may be used as pattern substrates 104 and 404 respectively. Although this disclosure illustrated and describes particular templates being applied to resist layers in a particular order, this disclosure contemplates any suitable templates being applied to resist layer in any suitable order, for example radial lines initially and circumferential lines subsequently.

In particular embodiments, pattern 906 may include a number of concentrically circular lines that may be of a width and pitch suitable for defining a bit pattern as described above. Furthermore, one or more portions of the concentrically circular lines may have a different width and pitch than other portions that may be used to define regions or zones of the media substrate surface having particular functionality. In particular embodiments, only a portion of the pattern 906 may annularly extend around the template in accordance with the data and the servo zones of the media substrate surface to which the pattern of bits 802 of template substrate 100 corresponds. For example, particular regions of pattern 906 may correspond to servo zones of a BPM, while other regions may correspond to data zones of the BPM.

In particular embodiments, pattern 908 may include radial lines of a width and pitch suitable for defining a bit pattern as described above. Furthermore, one or more portions of the radial lines may have a different width and pitch than other portions that may define bits in different regions or zones of the media substrate surface having particular functionality. As described above, the dimensions of radial lines of pattern 908 may be used to control the dimensions of the bits of the template substrate 100, and in turn, the BAR of the bit pattern of the corresponding BPM.

Figure 10:
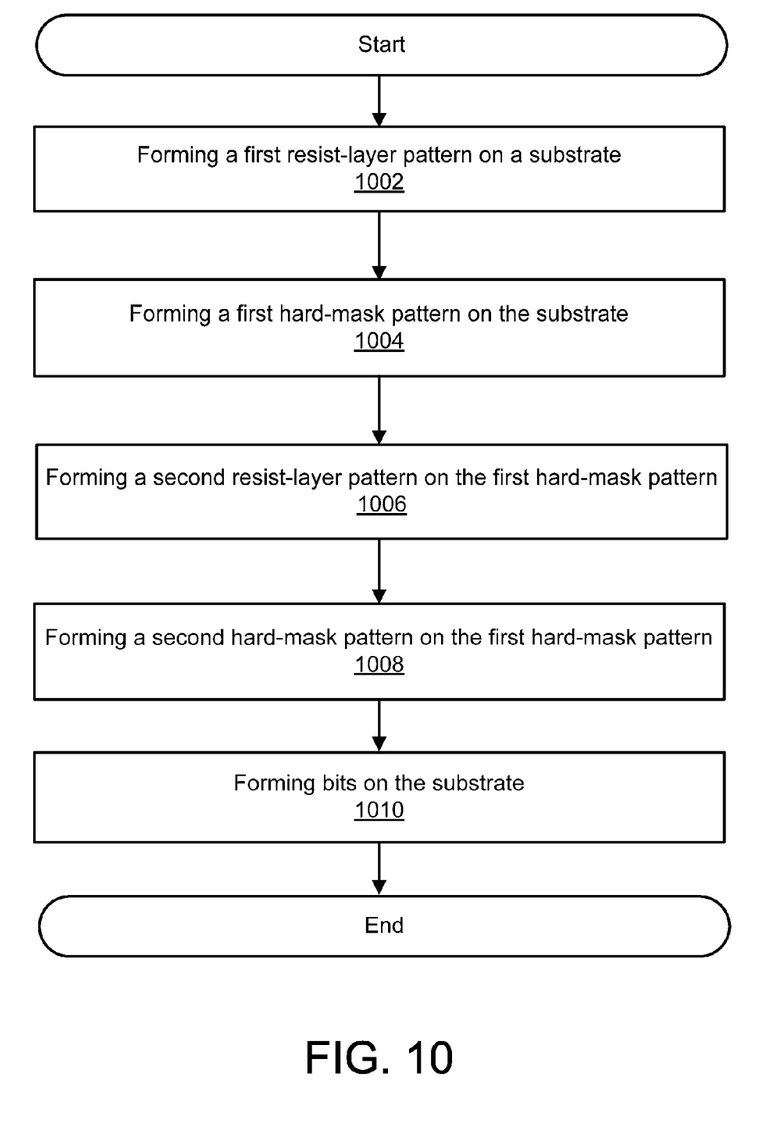
FIG. 10 illustrates an example flow diagram for fabricating a bit pattern on a template substrate, according to one aspect of the present description.

Any of a number of methods may be used to fabricate the concentrically circular lines of pattern 906 or radial lines of pattern 908 including, but are not limited to, e-beam lithography, interference lithography, photolithography, imprint lithography, or any combination thereof. In some embodiments, for example, the concentrically circular or radial lines may be fabricated using electron-beam lithography to establish a chemical pre-pattern (e.g., a binary pattern of regions with different wettability) in combination with lamella-forming DSA FIG. 10 illustrates an example flow diagram for fabricating a bit pattern on a template substrate, according to one aspect of the present description. At block 1002, a first resist-layer pattern is formed on a substrate. In particular embodiments, the first resist-layer pattern includes a number of features that have a first pitch distance. For example, the first resist-layer pattern may be a low-density pattern transferred to the first resist layer through imprinting by a first pattern substrate.

At block 1004, a first hard-mask pattern is formed on the substrate. In the particular embodiments, first hard-mask pattern includes features that have a pitch distance that is correlated to the pitch distance of the first resist-layer pattern by a first pre-determined multiple. As described above, the pitch distance of the features of the first hard-mask are defined by a DSA process that uses BCPs. Furthermore, the pitch distance of the features of the first hard-mask pattern is defined by the BCPs used in the DSA process. As an example, the features of the first hard-mask pattern may include a number of concentrically circular lines.

At block 1006, a second resist-layer pattern is formed on the first hard-mask pattern. In particular embodiments, the second resist-layer pattern includes features that have a second pitch distance. For example, the second resist-layer pattern may be a low-density pattern transferred to the second resist layer through imprinting by a second pattern substrate.

At block 1008, a second hard-mask pattern is formed on the first hard-mask pattern. In particular embodiments, the second hard-mask pattern includes features that have a pitch distance that is correlated to the second pitch distance of the second resist-layer pattern by a second pre-determined multiple. The pre-determined multiples may be integer multiples defined by the composition of the first and second BCPs. In particular embodiments, the features of the second hard-mask pattern include radial lines. Furthermore, the second hard-mask pattern may be aligned relative to the first hard-mask pattern such that the overlap of the features of the hard-mask patterns form a substantially 90° angle.

At block 1010, bits are formed on the substrate. In particular embodiments, the bits are defined by an overlap of the features of the first and second hard-mask patterns. As an example, the bits may be formed by selectively etching the first mask-layer pattern and selectively etching the second mask-layer pattern. The selective etch processes result in a surface of the substrate having a number of quadrilateral portions of the first mask layer that are defined by the overlap between the first and second hard-mask layers. As an example, the surface of the substrate may have substantially rectangular portions of the first mask layer. A portion of the substrate may be etched such that the bits are formed underneath the portions of the first mask layer on the surface of the substrate.

Figure 11:
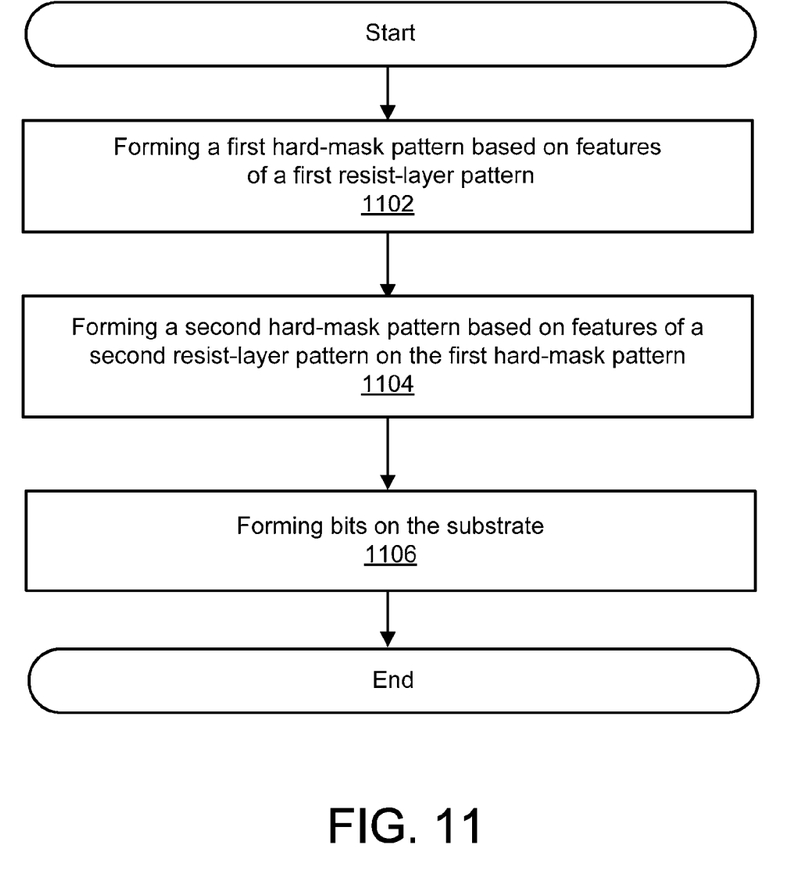
FIG. 11 illustrates another example flow diagram for fabricating a bit pattern on a template substrate, according to one aspect of the present description.

FIG. 11 illustrates another example flow diagram for fabricating a bit pattern on a template substrate, according to one aspect of the present description. At block 1102, a first hard-mask pattern is formed based on features of a first resist-layer pattern. In particular embodiments, the first hard-mask pattern includes features the pitch distance of the features of the first hard-mask layer is less than the pitch distance of the features of the first resist-layer pattern. Furthermore, the features of the first hard-mask pattern may have a pitch distance that is correlated by a pre-determined multiple to a pitch distance of the features of the first resist-pattern.

At block 1104, a second hard-mask pattern is formed based on features of a second resist-layer pattern on the first hard-mask pattern. In particular embodiments, the second hard-mask pattern includes features having a pitch distance that is defined by a second pre-determined multiple to the second pitch distance. Furthermore, the pitch distance of the features of the first hard-mask layer may be different than the pitch distance of the features of the second hard-mask layer pattern. In particular embodiments, the second hard-mask layer is aligned relative to the first hard-mask layer at a substantially 90° angle.

At block 1106, a number of bits are formed on the substrate. In particular embodiments, the bits are defined by an overlap of the features of the first and second hard-mask patterns. Furthermore, the first hard-mask layer may be preferentially etched such that the second hard-mask layer remains substantially intact and acts as an etch mask for the remaining portions of the first hard-mask layer protected by overlap with the second hard-mask layer. The second hard-mask layer may then be removed leaving the portions of the first hard-mask layer that may act as an etch mask to form the bit pattern on template substrate 100.

As provided herein, is a method that includes forming a first resist-layer pattern on a substrate. The first resist-layer pattern may include a number of features that have a first pitch distance. The method also includes forming a first hard-mask pattern on the substrate, where the first hard-mask pattern includes features that have a pitch distance that is correlated to the first pitch distance by a first pre-determined multiple. The method also includes forming a second resist-layer pattern on the first hard-mask pattern. The second resist-layer pattern includes a number of features that have a second pitch distance. The method also includes forming a second hard-mask pattern on the first hard-mask pattern, where the second hard-mask pattern includes features that have a pitch distance that is correlated to the second pitch distance by a second pre-determined multiple. The method also includes forming a plurality of bits on the substrate. The bits are defined by an overlap of the features of the first and second hard-mask patterns.

Also, provided herein, is an apparatus that includes a substrate and a first hard-mask pattern. The first hard-mask pattern includes a number of first features disposed over a top surface of the substrate. The apparatus also include a second hard-mask pattern disposed over the first hard-mask layer. The second hard-mask pattern includes a number of second features that overlap one or more of the first features. In particular embodiments, the first hard-mask pattern includes features that have a pitch distance that is correlated by a first pre-determined multiple to a pitch distance of the features of a first resist-layer pattern. Furthermore, the features of the second hard-mask pattern may have a pitch distance that is determined by a pre-determined multiple to a second pitch distance of a second resist-layer pattern. In particular embodiments, the first hard-mask layer is a different material than the second hard-mask layer. As an example, the first hard-mask layer may be a layer of chromium and the second hard-mask layer may be a layer of aluminum. The features of the first hard-mask pattern may include a number of concentrically circular lines and the features of the second hard-mask pattern may include a number of radial lines. In particular embodiments, an overlap of one or more the features of the first and second hard-mask patterns forms a substantially 90° angle. In other embodiments, one or more of the overlap of the features may for a rhomboidal shape.

Also, provided herein is an method that includes forming a first hard-mask pattern comprising a plurality of first features over a surface of a substrate; forming a second hard-mask pattern comprises a plurality of second features over the first hard-mask pattern; and forming a plurality of bits on the substrate, wherein the bits are defined by an overlap of the first features and the second features.

While the embodiments have been described and/or illustrated by means of particular examples, and while these embodiments and/or examples have been described in considerable detail, it is not the intention of the Applicant to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   forming a first resist-layer pattern on a substrate, wherein the first resist-layer pattern comprises a first plurality of features having a first pitch distance;
   forming a first hard-mask pattern on the substrate, wherein the first hard-mask pattern comprises a second plurality of features having a pitch distance that is correlated by a first pre-determined multiple to the first pitch distance;
   forming a second resist-layer pattern on the first hard-mask pattern, wherein the second resist-layer pattern comprises a third plurality of features having a second pitch distance;
   forming a second hard-mask pattern on the first hard-mask pattern, wherein the second hard-mask pattern comprises a fourth plurality of features having a pitch distance that is correlated by a second pre-determined multiple to the second pitch distance; and
   forming a plurality of bits on the substrate, wherein the plurality of bits is defined by an overlap of the features of the first and second hard-mask patterns.

2. The method of claim 1, further comprising aligning the first and second hard-mask patterns such that the overlap of the features forms a substantially 90° angle.

3. The method of claim 1, wherein the second plurality of features of the first hard-mask pattern comprises a plurality of concentrically circular lines and the fourth plurality of features of the second hard-mask pattern comprises a plurality of radial lines.

4. The method of claim 1, wherein the plurality of bits is substantially quadrilateral shaped.

5. The method of claim 1, wherein the pitch distance of the second plurality of features of the first hard-mask pattern is defined by a directed self-assembly (DSA) process using a first and second blocked copolymer (BCP).

6. The method of claim 1, wherein the pitch distance of the second plurality of features of the first hard-mask pattern is defined by a first and second blocked copolymer (BCP).

7. The method of claim 5, wherein the first and second pre-determined multiples are integer multiples defined by the first and second BCP.

8. The method of claim 1, wherein forming the plurality of bits on the substrate comprises:
   selectively etching the first hard-mask pattern; and
   selectively etching the second hard-mask pattern such that a surface of the substrate has a plurality of quadrilateral portions defined by the overlap between the features of the first and second hard-mask patterns.

9. The method of claim 8, wherein forming the plurality of bits on the substrate further comprises etching a portion of the substrate such that the plurality of bits is formed underneath the quadrilateral portions.

10. An method comprising:
    forming a first hard-mask pattern comprising a plurality of first features over a surface of a substrate;
    forming a second hard-mask pattern comprising a plurality of second features over the first hard-mask pattern; and
    forming a plurality of bits on the substrate, wherein the plurality of bits is defined by an overlap of the plurality of first features and the second features.

11. The method of claim 10, wherein a pitch distance of the plurality of first features is less than a pitch distance of the plurality of second features.

12. The method of claim 10, wherein the plurality of first features comprises a plurality of concentrically circular lines and the plurality of second features comprises a plurality of radial lines.

13. The method of claim 10, wherein forming the plurality of bits on the substrate comprises preferentially etching the first hard-mask pattern such that the second hard-mask pattern remains substantially intact.

14. The method of claim 10, wherein forming the plurality of bits on the substrate comprises aligning the second hard-mask pattern relative to the first hard-mask pattern at a substantially 90° angle.

\* \* \* \* \*